US006119134A

United States Patent [19]
Kigawa

[11] Patent Number: 6,119,134
[45] Date of Patent: Sep. 12, 2000

[54] INTERACTIVE GRAPHIC EDITING SYSTEM FOR DESIGNING INTEGRATED CIRCUITS

[75] Inventor: Naoki Kigawa, Kanagawa, Japan

[73] Assignee: Sony Corporation, Tokyo, Japan

[21] Appl. No.: 08/048,123

[22] Filed: Apr. 14, 1993

[30] Foreign Application Priority Data

Apr. 17, 1992 [JP] Japan .................................. 4-122849

[51] Int. Cl.[7] .................................................. G06F 17/24
[52] U.S. Cl. ............................................................ 707/502
[58] Field of Search ................................ 395/146, 147, 395/155, 156, 160, 161, 12, 600; 364/488–491, 578, 571.04, 802, 275.6, 474.24, 917.916, 41, 917.3, 47; 371/23; 326/101; 707/502

[56] References Cited

U.S. PATENT DOCUMENTS

| | | | |
|---|---|---|---|
| 4,984,180 | 1/1991 | Wada et al. | 364/518 |
| 5,299,307 | 3/1994 | Young | 395/161 |
| 5,309,371 | 5/1994 | Shikata et al. | 364/491 |

OTHER PUBLICATIONS

Daniel et al., "CAD Systems for IC Design", DALTCAD82, Jan. 1982, pp. 2–12.

Itoh et al., "ALE: A layout Generating and Editing System for Analog LSIs", Circuits and Systems, 1990 IEEE International Symposium, pp. 843–846.

Eesley et al., "ACAP–A System for the Interactive Graphical Capture of Module Generators", IEEE 1991 Custom Integrated Circuits Conference, pp. 22.1.1 to 22.1.4.

Shiraishi, "Interactive Hybrid IC Design System", Fujitsu Scientific and Technical Journal, Sep. 1980 pp. 65–80.

*Primary Examiner*—Stephen S. Hong
*Assistant Examiner*—Cesar B. Paula
*Attorney, Agent, or Firm*—Limbach & Limbach L.L.P.

[57] ABSTRACT

An interactive graphic editing system for designing a semiconductor integrated circuit includes an attribute data base storage unit for storage of attributes of editing objects necessary for simulating characteristics of the semiconductor integrated circuit being designed, and an editing unit for enabling the editing objects to be manipulated and for fetching data from the attribute data base storage unit on selection of the editing objects as to whether or not the attributes for the selected editing objects can be set. The graphic editing system informs an operator as to feasibility of the selected attribute setting by making an inquiry at the attribute data base on selection of the editing objects as to whether or not the attributes concerning the selected editing objects can be set and displays an attribute setting menu for editing objects for which attributes can be set without displaying the attribute setting menu for designing objects for which attributes cannot be set.

7 Claims, 7 Drawing Sheets

INTERACTIVE GRAPHIC EDITING SYSTEM FOR DESIGNING INTEGRATED CIRCUITS

BACKGROUND OF THE INVENTION

1. Field of the Invention

This invention relates to a graphic editing system and, more particularly, to a graphic editing system of a so-called CAD system employed for designing semiconductor integrated circuits.

2. Description of the Related Art

Recently, in designing electronic circuits, a computer aided design (CAD) is extensively employed as a design supporting system. For example, designing of semiconductor integrated circuits, such as large scale integrated circuits (LSI) or charge coupled device image sensor (CCD image sensors), consists of functional designing for designing functional specifications of e.g. a large scale integrated circuit, based on system specifications, logical designing for designing a logical circuit based on functional specifications obtained by functional designing and layout designing for designing a so-called mask pattern based on the connection information of the logical circuits obtained by logical designing and verifying the function and characteristics using a simulation system. In each of these designing stages, CAD is employed whenever the necessity arises.

In the layout designing, which is most crucial in designing semiconductor integrated circuits, it is required to render the chip area as small in size as possible under manufacturing process constraints. The layout designing by CAD is roughly classified into an automatic layout designing of automatically arraying and interconnecting cells or functional blocks by an electronic computer and an interactive layout designing carried out in a conversational mode by a designer using a graphic editing system including a graphic display equipped with a pointing device, such as a mouse. After completion of designing of a mask pattern by automatic or interactive layout designing, the functions or characteristics of the semiconductor integrated circuit being designed are simulated based on preset attributes concerning editing objects, such as lines or dots, as determined by manufacturing process conditions.

With the above-described graphic editing system, data concerning coordinates for graphic display or interconnection between the objects are processed independently of a simulating operation. In other words, for performing a simulating operation, it becomes necessary to perform an operation of setting attributes for various editing objects after completion of the mask pattern designing or graphic designing operation. For this reason, it is a frequent occurrence that attribute setting is not made for certain objects through inadvertence and the objects for which attributes have not been set are found out after the start of the simulation operation, producing inappropriate results for the simulation.

OBJECT AND SUMMARY OF THE INVENTION

In view of the above-depicted status of the art, it is an object of the present invention to provide a graphic editing system which is superior in flexibility and man-machine interfacing such that failure in attribute setting through inadvertence may be prevented from occurring.

In accordance with the present invention, there is provided an interactive graphic editing system for designing a semiconductor integrated circuit comprising an attribute data base storage unit in which attributes of various editing objects necessary for simulating characteristics of the semiconductor integrated circuit being designed are stored, and an editing means for enabling the editing objects to be manipulated and for fetching data from the attribute data base storage unit on selected editing objects can be set. selected editing objects can be set.

When the editing object(s) are selected, the graphic editing system informs an operator as to the feasibility of the attribute setting by fetching data from at the attribute data base on selection of the editing objects determine whether or not the attributes concerning the selected editing objects can be set and display an attribute setting menu for the editing objects for which attributes can be set without displaying the attribute setting menu for the editing objects for which attributes cannot be set.

Other objects and advantages of the present invention will become more apparent from the following description of the preferred embodiment and the claims.

DESCRIPTION OF THE PREFERRED EMBODIMENTS

Figure 1:
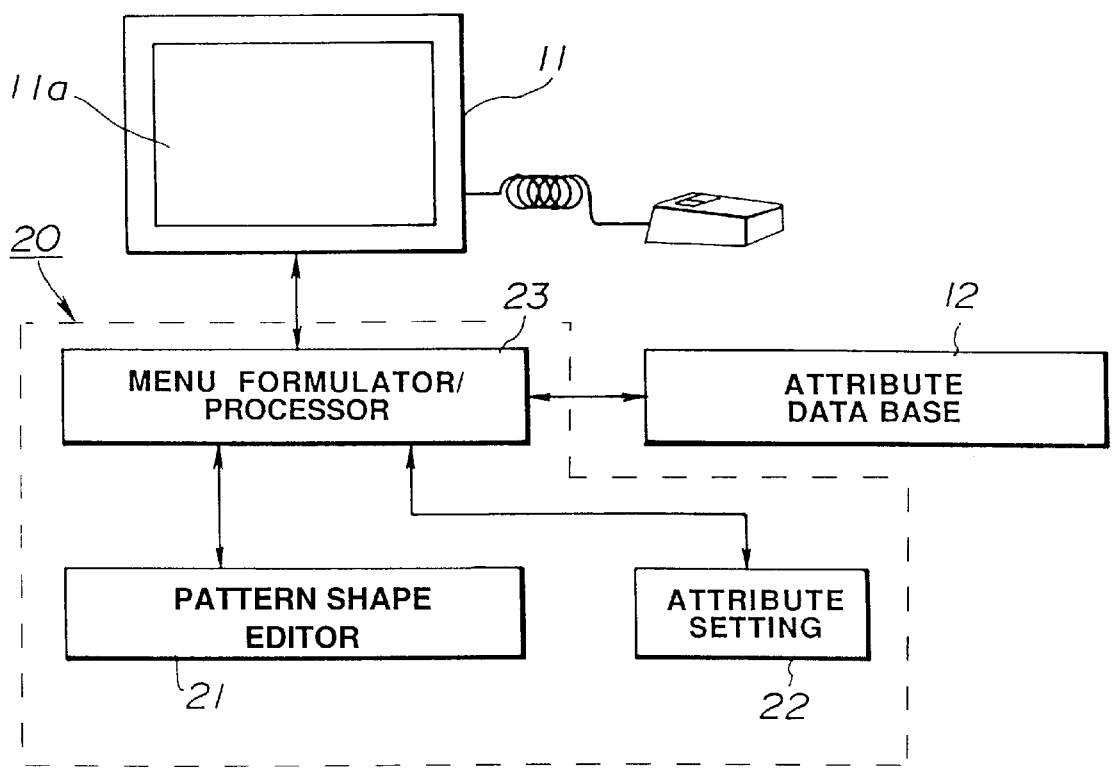
FIG. 1 is a schematic view showing an arrangement of a graphic display apparatus according to the present invention.

Referring to the drawings, an embodiment of the graphic editing system according to the present invention is explained in detail.

The graphic editing system includes a graphic terminal 11 for interactively designing a semiconductor integrated circuit, that is, designing implying interactivity between the designer and the system, an attribute data base 12 in which attributes of various editing objects necessary for simulating characteristics of the semiconductor integrated circuits being designed are stored, and an editing unit 20 which enables the editing objects to be manipulated and which, when the editing objects are selected, makes an inquiry to i.e. fetched data from the attribute data base 12 as to whether or mot the attributes concerning the selected editing objects can be set, while providing the result of the inquiry to the designer via the graphic terminal 11, as shown in FIG. 1.

The editing unit 20 is made up of pattern shape editing unit 21 for editing the pattern or shape of a pattern based on the input information from graphic terminal 11, an attribute setting unit 22 for setting attributes in the attribute data base 12 based on the input information from the graphic terminal 11, and a processing unit 23 for displaying an operating menu etc. on the graphic terminal 11 and for controlling the pattern shape editing unit 21 and the attribute setting unit 22, as shown in FIG. 1. The functions from the pattern shape editing unit 21 to the processing unit 23 are realized by means of a software program in a central processing unit (CPU) of an engineering workstation.

The graphic terminal 11 is a graphic display equipped with pointing devices, such as a so-called mouse or a tablet, and is arranged so that a designer of a semiconductor integrated circuit, such as a designer of a CCD image sensor, is able to operate editing objects, such as lines or dots, for performing a pattern editing operation, as he or she views an operating menu or pattern displayed on the graphic terminal.

Figure 2:
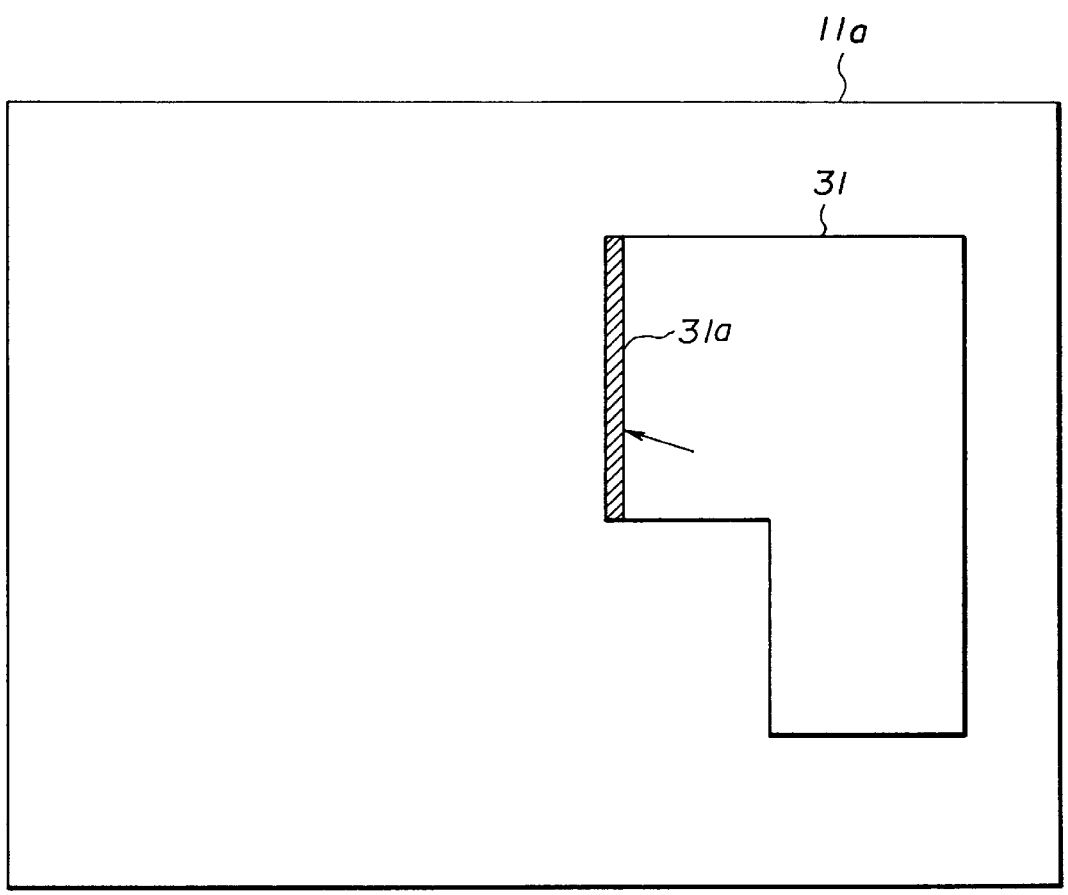
FIG. 2 is a front view showing a display example of a graphic terminal constituting the graphic editing system shown in FIG. 1.

Specifically, if the designer selects a line segment 31a, which is a side of a pattern 31 displayed on a screen 11a of the graphic terminal 11, using a mouse, as shown in FIG. 2, the graphic terminal 11 supplies the input information for this operation to the processing unit 23.

Figure 3:
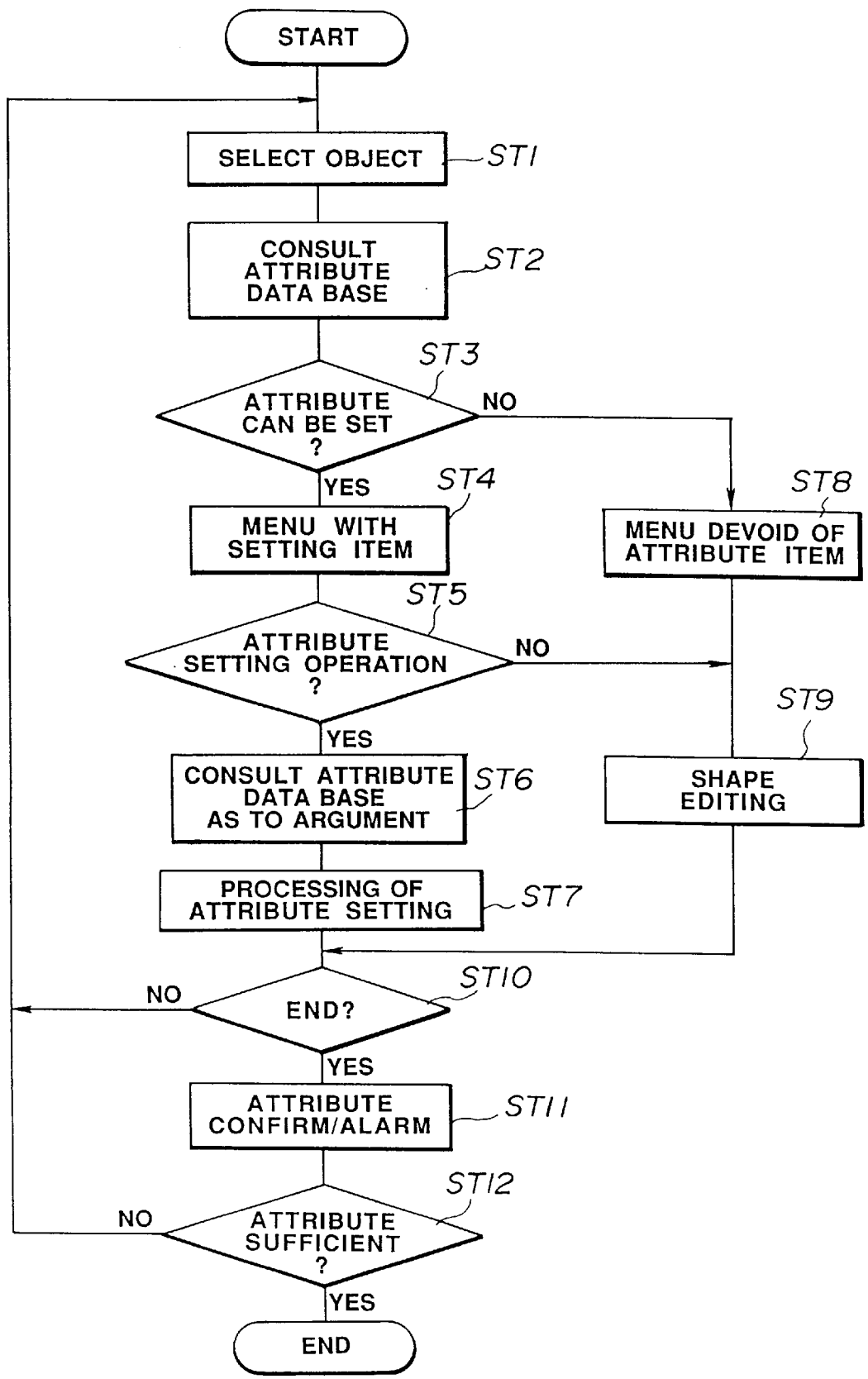
FIG. 3 is a flow chart for illustrating the operation of a processing unit constituting the graphic editing system shown in FIG. 1.

Referring to the flow chart of FIG. 3, the processing unit 23 accepts the input information from the editing unit 21 at step ST1 before proceeding to step ST2.

At step ST2, processing unit 23 makes an inquiry as to attributes concerning the line segment 31a before proceeding to step ST3.

At step ST3, processing unit 23 decides, based on a response from attribute data base 12, if the attributes can be set. If the result of decision is YES, processing unit 23 proceeds to step ST4 and, if otherwise, it proceeds to step ST8.

Figure 4:
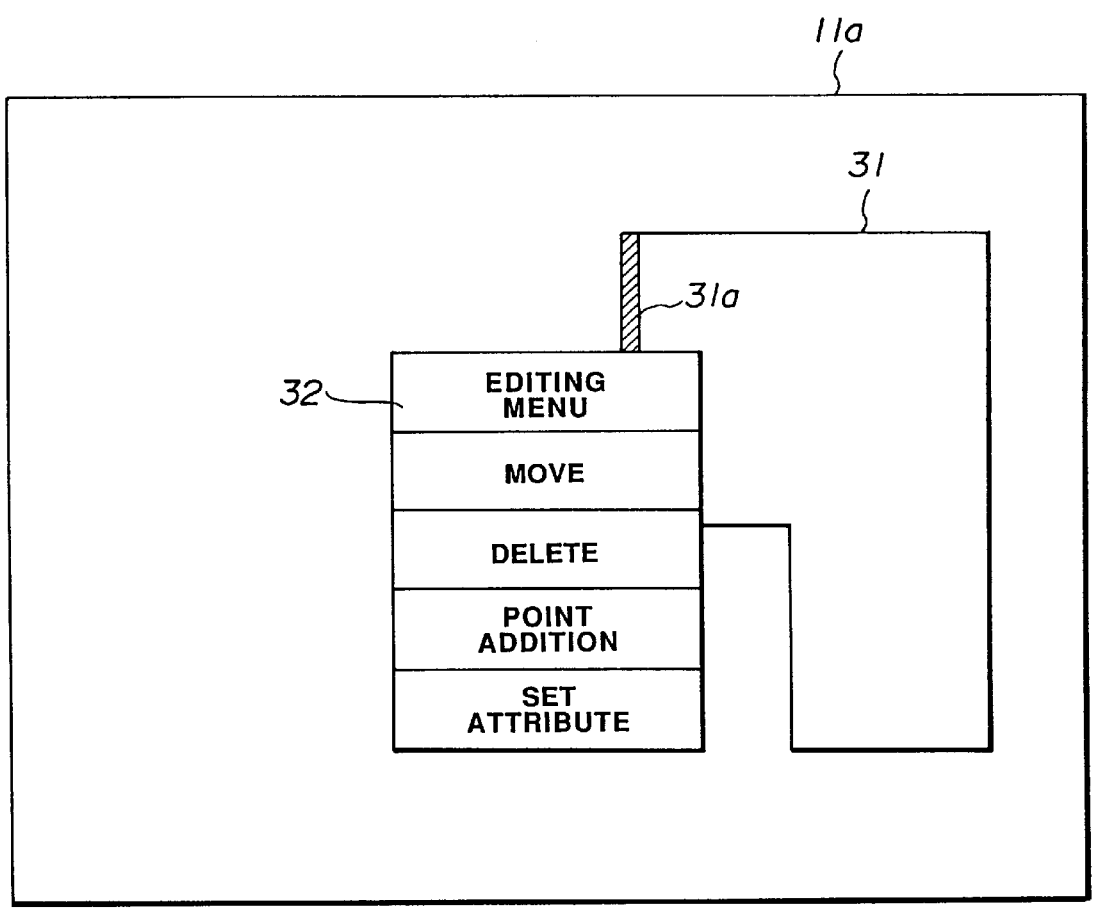
FIG. 4 is a plan view showing an example of an operating menu displayed on the graphic terminal shown in FIG. 2.

At step ST4, processing unit 23 causes the display on screen 11a of an operating menu 32 consisting of an editing menu item, an object moving item, an object deleting item, a point addition item for point addition and an attribute setting item for setting the attributes, as shown in FIG. 4, before proceeding to step ST5.

At step ST5, processing unit 23 decides if the attribute setting item has been selected in the displayed operating menu 32. If the result of decision is YES, processing unit 23 proceeds to step ST6 and, if otherwise, it proceeds to step ST9.

At step ST6, processing unit 23 makes an inquiry to the attribute data base 12 to determine the number of arguments required for setting the attributes for the line segment 31a and the format before proceeding to step ST7. Specifically, processing unit 23 makes an inquiry as to if parameters necessary for heat calculation, or parameters for deciding the shape of an edge formed in the silicon substrate, can be set.

Figure 5:
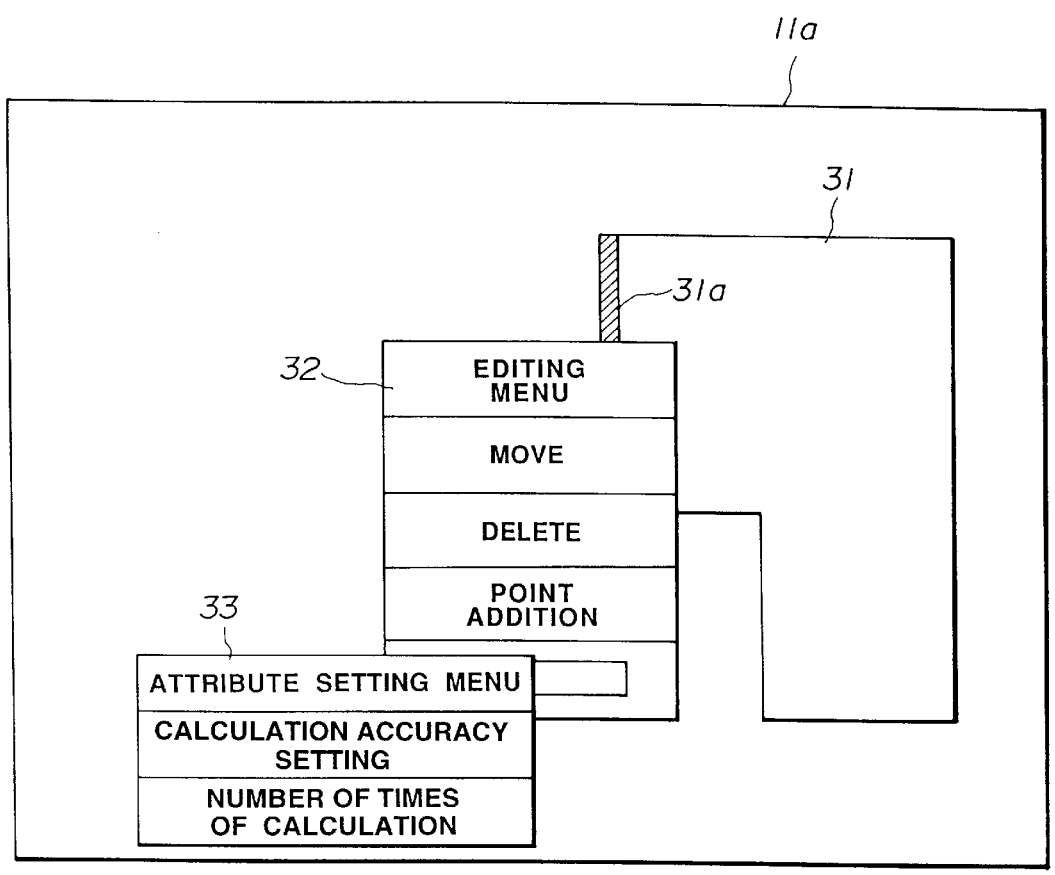
FIG. 5 is a plan view showing an example of a setting menu displayed on the graphic terminal shown in FIG. 2.
Figure 6:
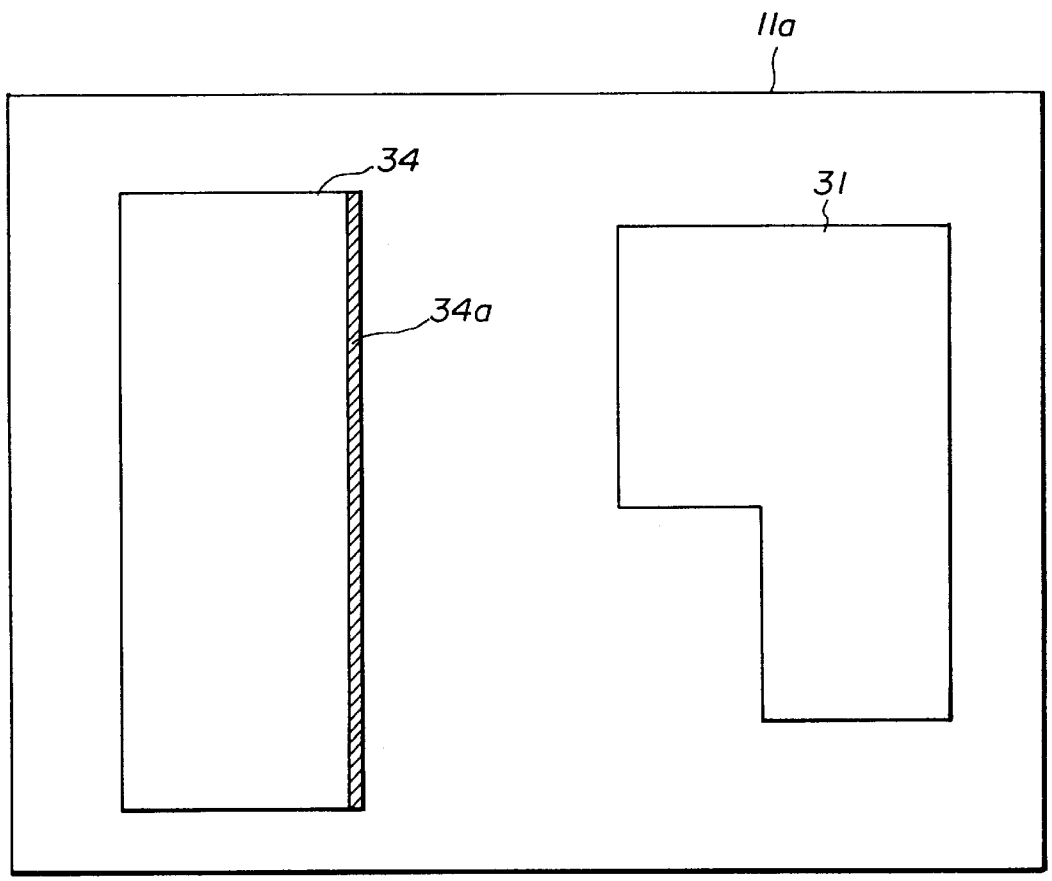
FIG. 6 is a plan view showing another example of a graphic terminal.

At step ST7, processing unit 23 displays a setting menu 33 consisting of an attribute setting menu item for setting the attributes, a calculation accuracy setting item for setting simulation precision and a number of times of calculation setting item for setting the number of times of calculation during simulation, while supplying the selected item as supplied from the graphic terminal 11 and the input information therefor to the attribute setting unit 22, as shown in FIG. 5, before proceeding to step ST10. Specifically, if the attribute setting menu item has been selected for the line segment 31a, processing unit 23 eliminates default values, which are not in need of being newly set, from the attributes, based on the results of the inquiry obtained at step ST6, and displays the remaining attribute items that are in need of being set, at the same time that the processing unit 23 supplies the input information entered in accordance with the items to the attribute setting unit 22. The attribute setting unit stores the selected attributes in the attribute data base 12 based on the input information.

Figure 7:
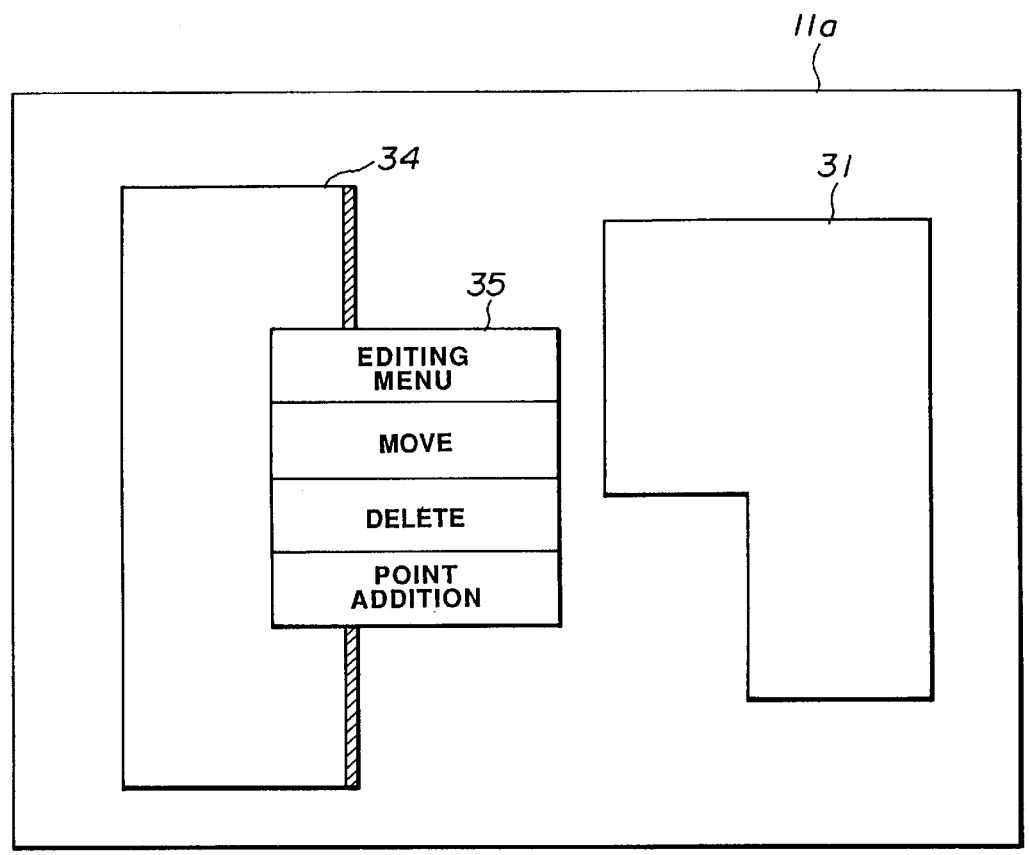
FIG. 7 is a plan view showing another example of an operating menu displayed on the graphic terminal shown in FIG. 6.

On the other hand, if a line segment 34a of a pattern 34 displayed on the screen 11a of the graphic terminal 11 is selected and the attributes for this line segment 34a cannot be set, processing unit 23 proceeds to step ST8. At step ST8, processing unit 23 displays an operating menu 35 which is destitute of attribute setting items, that is the editing menu item, movement item, deletion item and point addition item, in distinction from the operating menu 32, as shown in FIG. 7, before proceeding to step ST9.

At step ST9, processing unit 23 supplies the selected item supplied from graphic terminal 11 and the input information therefor to the pattern shape editing unit 21, before proceeding to step ST10. At this time, pattern shape editing unit 21 performs, by means of software in a workstation CPU, an editing operation, such as change, addition or deletion of a point or a line, based on the input information.

At step ST10, processing unit 23 decides if the pattern editing operation has come to an end. If the result of decision is YES, that is if the designer has made an operation of termination, processing unit 23 proceeds to step ST11. If otherwise, processing unit 23 reverts to step ST1 to repeat a loop formed by steps ST1 to ST10.

At step ST11, processing unit 23 confirms that the attributes have been set for all of the objects. If any attributes are not set, that effect is apprised to the designer by way of an alarm. Processing unit 23 then proceeds to step ST12.

At step ST12, processing unit 23 decides, based on the results of information at step ST11, if there is any object for which the attributes have not been set. If the result of decision is YES, processing unit 23 reverts to step ST1 and, if otherwise, processing unit 23 terminates the operation.

At a time point when the pattern editing is terminated, the attributes are set for all of the objects for which the attributes can be set. In other words, failure in setting the attributes may be prevented from occurring to assure an unobjectionable simulation.

Besides, by eliminating attribute setting items from the menu for the objects for which the attributes cannot be set, the designer is relieved of making unnecessary menu selection to assure a superior man-machine interfacing.

For enabling the attributes to be set during pattern editing, it may be contemplated to make the attribute data base 12 part of the editing unit 20 by way of departing from the illustrated embodiment. However, should any change be necessary in the attributes as a result of technological progress or expansion of simulation functions, it becomes necessary to change the editing unit 20, that is the program of the pattern editor in its entirety unless programming access can be readily had to the attribute data base 12. In other words, technological advancement may be flexibly accommodated by functionally separating the attribute data base 12 from the editing unit 20.

It is to be noted that the present invention is not limited to the above described embodiments. For example, if any attributes have not been set at step ST11, suitable values may be automatically set for the non-set attributes.

It will be appreciated that failure on the part of the designer in setting the attributes may be prevented by making an inquiry at the attribute data base, displaying a menu for setting the objects for which the attributes can be set and not displaying the menu for setting the attributes for objects for which the attributes cannot be set for apprising the designer as to whether or not the attributes can be set. Since unnecessary menu or item is not displayed, a graphic editing system may be provided which is superior in man-machine interfacing. Besides, by separating the attribute data base from the editing means, technological advancement or simulator function addition simulator may be accommodated flexibly.

What is claimed is:

1. An interactive graphic editing system for designing a semiconductor integrated circuit comprising:

an attribute data base storage unit in which attributes of various editing objects necessary for simulating characteristics of the semiconductor integrated circuit being designed are stored, and editing means for enabling the editing objects to be manipulated and for fetching data from the attribute data base storage unit on selection of the editing objects to determine whether or not the attributes for the selected editing objects can be set and, if the attributes can be set, allowing a user to select attributes for the editing objects.

2. The interactive graphic editing system as claimed in claim 1, wherein the attribute data base storage unit is not incorporated within the editing means.

3. The interactive graphic editing system as claimed in claim 1, wherein the functions of the editing means are realized in a programmed CPU of a workstation.

4. An interactive graphic editing method for designing a semiconductor integrated circuit comprising the steps of:

selecting an editing pattern object displayed on a graphic display of a graphic terminal by a pointing device, causing a processing unit to fetch from an attribute data base storage unit attributes of the editing pattern object, causing the processing unit to decide if attributes can be set for the editing pattern object based on the fetching of attribute data from the attribute data base storage unit, causing the processing unit to issue instructions to display menu data inclusive of an attribute setting item on the graphic display if a decision is made that the attributes can be set, deciding if the attribute setting item among the displayed menu data has been selected, fetching from the attribute data base storage unit all data necessary for attribute setting when the attribute setting item has been selected, and permitting attributes to be set for the editing pattern object based on the attribute data.

5. An interactive graphic editing system for designing a semiconductor integrated circuit comprising:

an attribute data base storage unit in which attributes of various editing objects necessary for simulating characteristics of the semiconductor integrated circuit being designed are stored;

a graphic terminal to which coordinate data are entered and which displays pattern data concerning the editing objects based on the coordinate data, the graphic terminal including a graphic display and a pointing device; and editing means for enabling the editing objects to be manipulated and for fetching data from the attribute data base storage unit on selection of the editing objects to determine, based on the data fetched from the attribute data base storage unit, whether or not the attributes for the selected editing objects can be set and, if the attributes can be set, allowing a user to select attributes for the editing objects by means of the pointing device, and wherein the editing means informs an operator via the graphic terminal whether or not the selection of an attribute setting can be made for a particular editing object by displaying an attribute setting menu only for those editing objects for which attributes can be set and not displaying an attribute setting menu for editing objects for which an attribute can not be set.

6. The interactive graphic editor apparatus as claimed in claim 5 wherein the pointing device is a mouse.

7. The interactive graphic editing system as claimed in claim 6 wherein the editing means comprises:

a pattern figure editing unit for editing the shape of the pattern based on input data from the graphic terminal, an attribute setting unit for setting the attributes in the attribute data base storage unit based on the input data from the graphic terminal, and a processing unit for displaying an operating menu on the graphic terminal and controlling the pattern shape editing unit and the attribute setting unit.

* * * * *